(12) United States Patent
Kosuge et al.

(10) Patent No.: US 9,530,704 B2
(45) Date of Patent: Dec. 27, 2016

(54) POLISHING APPARATUS AND WEAR DETECTION METHOD

(71) Applicant: Ebara Corporation, Tokyo (JP)

(72) Inventors: Ryuichi Kosuge, Tokyo (JP); Tadakazu Sone, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/836,518

(22) Filed: Aug. 26, 2015

(65) Prior Publication Data

US 2015/0364391 A1  Dec. 17, 2015

Related U.S. Application Data

(63) Continuation of application No. 14/228,424, filed on Mar. 28, 2014, now Pat. No. 9,144,878.

(30) Foreign Application Priority Data

Mar. 29, 2013 (JP) .................................. 2013-072399

(51) Int. Cl.
*B24B 37/00* (2012.01)
*H01L 21/66* (2006.01)
(Continued)

(52) U.S. Cl.
CPC ............. *H01L 22/26* (2013.01); *B24B 37/005* (2013.01); *B24B 49/00* (2013.01); *B24B 53/017* (2013.01);
(Continued)

(58) Field of Classification Search
CPC ............... H01L 22/26; H01L 21/30625; H01L 21/67075; B24B 37/005; B24B 49/00; B24B 53/017
(Continued)

(56) References Cited

U.S. PATENT DOCUMENTS 6,045,434 A * 4/2000 Fisher, Jr. ............. B24B 49/183
                                                         451/10
6,074,277 A * 6/2000 Arai ...................... B24B 37/105
                                                         451/270
(Continued)

FOREIGN PATENT DOCUMENTS

JP       2005-022028       1/2005
JP       2006-272549      10/2006
(Continued)

*Primary Examiner* — George Nguyen
(74) *Attorney, Agent, or Firm* — Leydig, Voit & Mayer, Ltd.

(57) ABSTRACT

There is provided a polishing apparatus capable of detecting uneven wear occurring on a polishing pad and detecting an appropriate replacement timing of the polishing pad. The polishing apparatus detects, every predetermined time, a value of rotation speed or a value of rotation torque of a table drive shaft for rotationally driving a polishing table or a dresser drive shaft for driving a dresser, or a value of swing torque of a dresser swing shaft for driving the dresser; calculates a change quantity thereof based on the value of the detected rotation speed, the value of the detected rotation torque, or the value of the detected swing torque; determines whether or not the change quantity exceeds a predetermined value; and notifies a user of a warning when a determination is made that the change quantity exceeds the predetermined value.

16 Claims, 3 Drawing Sheets

(51) Int. Cl.
  *B24B 37/005* (2012.01)
  *B24B 53/017* (2012.01)
  *B24B 49/00* (2012.01)
  *H01L 21/306* (2006.01)
  *H01L 21/67* (2006.01)

(52) U.S. Cl.
  CPC ... *H01L 21/30625* (2013.01); *H01L 21/67075* (2013.01)

(58) Field of Classification Search
  USPC .............. 451/5, 41, 285–290, 443, 444
  See application file for complete search history.

(56) References Cited

U.S. PATENT DOCUMENTS

| | | | | |
|---|---|---|---|---|
| 6,517,413 B1* | 2/2003 | Hu | ........................ | B24B 37/013 451/285 |
| 6,517,414 B1* | 2/2003 | Tobin | .................... | B24B 53/017 451/21 |
| 6,910,942 B1* | 6/2005 | Dornfeld | ............... | B24B 37/013 451/285 |
| 7,150,675 B2 | 12/2006 | Kramer et al. | | |
| 8,096,852 B2* | 1/2012 | Deshpande | ........... | B24B 37/005 451/5 |
| 8,662,956 B2* | 3/2014 | Seo | ........................ | B24B 53/017 451/21 |
| 2005/0282475 A1* | 12/2005 | Lujan | .................... | B24B 53/017 451/56 |
| 2010/0035518 A1* | 2/2010 | Chang | .................. | B24B 37/042 451/6 |

FOREIGN PATENT DOCUMENTS

| | | |
|---|---|---|
| JP | 2007-529111 A | 10/2007 |
| JP | 2011-530809 A | 12/2011 |
| JP | 2012-056029 | 3/2012 |

\* cited by examiner

POLISHING APPARATUS AND WEAR DETECTION METHOD

CROSS-REFERENCE TO RELATED APPLICATIONS

This patent application is a continuation patent application of U.S. application Ser. No. 14/228,424, filed on Mar. 28, 2014, and claims priority to Japanese Patent Application No. 072399/2013, filed Mar. 29, 2013, both of which preceding patent applications are incorporated by reference.

BACKGROUND OF THE INVENTION

In recent years, semiconductor devices have become smaller and smaller, and device structures have accordingly become more complicated. The process of planarizing the semiconductor wafer surface is assumed to be a very important process in fabrication of the semiconductor devices. A typical technique for use in the surface planarization is chemical mechanical polishing (CMP). In the chemical mechanical polishing, a polishing liquid containing abrasive particles such as silica ($SiO_2$) is supplied to the polishing surface of a polishing pad, and a semiconductor wafer is in sliding contact with the polishing surface, to thereby polish the surface of the semiconductor wafer. The polishing pad may be replaced with a fixed abrasive pad made by bonding the abrasive particles by a binder.

The chemical mechanical polishing is performed using a CMP apparatus. A typical CMP apparatus includes a polishing table having a polishing pad attached to an upper polishing surface thereof, and a top ring for holding a substrate such as a semiconductor wafer, which is a workpiece to be polished. While the polishing table and the top ring are rotated about their respective own axes, the top ring presses the substrate against the polishing surface (upper surface) of the polishing pad at a predetermined pressure and a polishing liquid is supplied to the polishing surface, to thereby polish the substrate surface to a flat and mirror finish. A typical polishing liquid is an alkali solution having fine abrasive particles such as silica suspended therein. The substrate is polished by a combination of a chemical polishing action by the alkali and a mechanical polishing action by the abrasive particles.

When the substrate is polished, the abrasive particles and polishing debris adhere to the polishing surface of the polishing pad. As a result, characteristics of the polishing pad are changed and the polishing capability is lowered. For this reason, as the substrate polishing is repeated, the polishing rate is lowered and uneven polishing occurs. Thus, in order to condition the polishing surface of the deteriorated polishing pad, a dressing device is provided adjacent to the polishing table.

A typical dressing apparatus includes a rotatable dresser head and a dressing member secured to the dresser head. While the dresser head is rotated about its own axis, the dressing apparatus presses the dressing member against the polishing surface of the polishing pad on the rotating polishing table, to thereby remove the abrasive liquid and the cutting debris from the polishing surface and planarize and condition (dress) the polishing surface. A typical dressing member is a workpiece having diamond particles electrodeposited on a surface (dressing surface) in contact with the polishing surface.

Note that the polishing surface of the polishing pad is worn due to polishing of a specific number of substrates and due to the dressing as described above. Thus, when the wear of the polishing pad reaches a certain level, the polishing pad needs to be replaced. The substrate cannot be polished in a state in which the polishing pad is worn, and thus it is necessary to determine an appropriate replacement timing of the polishing pad.

In light of this, in order to detect wear of a polishing, namely, an appropriate replacement timing of the polishing pad, there is known a technique of estimating the service life of the polishing pad based on the rotation speed or the rotation torque of an electric motor for a pad conditioning assembly (see National Publication of International Patent Application No. 2007-529111).

In addition, there is known a technique of detecting rotation torque, sweep torque, and other torque of a conditioning disk for dressing, and then detecting wear of a polishing pad based on the detected values (see National Publication of International Patent Application No. 2011-530809).

However, the CMP device may encounter the need to replace the polishing pad when the entire surface of the polishing pad is worn and uneven wear occurs before the useful service life has elapsed. For example, when the polishing pad is attached to the polishing table of the CMP device, air (bubbles) may be mixed between the polishing table and the polishing pad, resulting in that a mixed air portion of the polishing pad slightly rises with respect to the polishing table. Note that although not limited thereto, some unevenness may occur on the surface of the polishing pad due to other causes. When chemical mechanical polishing is performed on the substrate or dressing is performed on the polishing pad in such a state, the contact pressure of the raised portion of the polishing pad is stronger than that of other portions, causing wear, that is, whereby uneven wear occurs. The chemical mechanical polishing performed on the substrate in the state in which uneven wear occurs on the polishing pad may reduce the planarization of the polished substrate and the polishing rate.

Furthermore, there is known a technique of detecting a frictional force or an impact force occurring between a pad dresser (dresser head) and a polishing pad of a dressing device when the polishing pad of the dressing device is dressed (see Japanese Patent Laid-Open No. 2005-022028).

Furthermore, there is known a technique for a polishing apparatus which calculates an amount of wear of a polishing pad from the height of the polishing pad and diagnoses the state of the polishing surface of the polishing pad based on the amount of wear of the polishing pad and torque or current of a polishing table rotating motor and torque or current of a top ring rotating motor (see Japanese Patent Laid-Open No. 2012-056029.

Still furthermore, there is known a technique for a dressing device which detects current flowing in a motor for rotating a polishing table having a polishing surface when the polishing surface is dressed, to thereby detect a friction load acting between the polishing surface and the dresser (dresser head) (see Japanese Patent Laid-Open No. 2006-272549).

SUMMARY OF THE INVENTION

In an embodiment, an apparatus is used to polish a substrate. This apparatus comprises: a polishing table having a surface for disposing a polishing pad; a table drive shaft configured to rotate the polishing table; a substrate holding device configured to hold a substrate so as to press a surface of the substrate against the polishing pad; a dressing unit having a dressing surface in sliding contact with the polishing pad; a dresser swing shaft configured to swing the dressing unit between a position on the polishing table and a position outside the polishing table; a dresser drive shaft configured to rotate the dressing unit; a sensor that detects, every predetermined time, at least one value of a value of rotation speed of the table drive shaft, a value of rotation torque of the table drive shaft, a value of rotation speed of the dresser drive shaft, a value of rotation torque of the dresser drive shaft, and a value of swing torque of the dresser swing shaft; and a control unit configured to calculate a change quantity of values of rotation speed of the table drive shaft, a change quantity of values of rotation torque of the table drive shaft, a change quantity of values of rotation speed of the dresser drive shaft, a change quantity of values of rotation torque of the dresser drive shaft, or a change quantity of values of swing torque of the dresser swing shaft based on the detected value(s); and to determine whether or not the change quantity exceeds a predetermined value.

According to the above-described embodiment, the control unit uses a difference between a value calculated based on continuously detected values from among the detected values predetermined time and a value calculated based on other continuously detected values from among the detected values every predetermined time, as the change quantity of the values of the rotation torque of the table drive shaft, the change quantity of the values of the rotation torque of the dresser drive shaft, or the change quantity of the values of the swing torque of the dresser swing shaft.

According to the above-described embodiment, the control unit uses a difference between a maximum value and a minimum value of the values of the detected rotation speed of the table drive shaft as the change quantity of the values of the rotation speed of the table drive shaft or uses a difference between a maximum value and a minimum value of the values of the detected rotation speed of the dresser drive shaft as the change quantity of the values of the rotation speed of the dresser drive shaft.

According to the above-described embodiment, the polishing apparatus comprises a warning notification unit that issues a warning when the control unit determines that the change quantity exceeds a predetermined value.

According to the above-described embodiment, the control unit counts a number of times the change quantity is determined to exceed the predetermined value, and determines whether or not the number of times per predetermined time exceeds a predetermined number of times.

According to the above-described embodiment, the polishing apparatus comprises a warning notification unit that issues a warning when the control unit determines that the number of times per predetermined time exceeds the predetermined number of times.

According to the above-described embodiment, the sensor starts to detect at least one of the values of the rotation speed of the table drive shaft, the values of the rotation torque of the table drive shaft, the values of the rotation speed of the dresser drive shaft, the values of the rotation torque of the dresser drive shaft, and the values of the swing torque of the dresser swing shaft after a predetermined time elapses since the dressing unit starts dressing.

In another embodiment, a wear detection method is a wear detection method of detecting wear of a polishing pad disposed in a polishing table for use in a polishing apparatus, the wear detection method comprising: a step of detecting, every predetermined time, a value of rotation speed of a table drive shaft for rotationally driving the polishing table, a value of rotation torque of the table drive shaft, a value of rotation speed of a dresser drive shaft for rotationally driving a dresser, a value of rotation torque of the dresser drive shaft, or a value of swing torque of a dresser swing shaft for swinging the dresser; a step of calculating a change quantity of values of rotation speed of the table drive shaft, a change quantity of values of rotation torque of the table drive shaft, a change quantity of values of rotation speed of the dresser drive shaft, a change quantity of values of rotation torque of the dresser drive shaft, or a change quantity of values of swing torque of the dresser swing shaft based on the detected value(s); and a step of determining whether or not the change quantity exceeds a predetermined value.

According to the above-described another embodiment, the step of calculating the change quantity calculates a difference between a value calculated based on continuously detected values from among the detected values every predetermined time and a value calculated based on other continuously detected values from among the detected values every predetermined time, as the change quantity of the values of the rotation torque of the table drive shaft, the change quantity of the values of the rotation torque of the dresser drive shaft, or the change quantity of the values of the swing torque of the dresser swing shaft.

According to the above-described another embodiment, the step of calculating the change quantity calculates a difference between a maximum value and a minimum value of the values of the detected rotation speed of the table drive shaft as the change quantity of the values of the rotation speed of the table drive shaft or calculates a difference between a maximum value and a minimum value of the values of the detected rotation speed of the dresser drive shaft as the change quantity of the values of the rotation speed of the dresser drive shaft.

According to the above-described another embodiment, the wear detection method comprises a step of issuing a warning when a determination is made that the change quantity exceeds a predetermined value.

According to the above-described another embodiment, the step of determining comprises a step of counting a number of times the change quantity is determined to exceed the predetermined value, and a step of determining whether or not the number of times per predetermined time exceeds a predetermined number of times.

According to the above-described another embodiment, the wear detection method comprises a step of issuing a warning when a determination is made that a number of times per predetermined time exceeds the predetermined number of times.

According to the above-described another embodiment, the step of detecting starts to detect at least one of the value of the rotation speed of the table drive shaft, the value of the rotation torque of the table drive shaft, the value of the rotation speed of the dresser drive shaft, the value of the rotation torque of the dresser drive shaft, and the value of the swing torque of the dresser swing shaft after a predetermined time elapses since the dresser starts dressing.

DETAILED DESCRIPTION OF THE PREFERRED EMBODIMENTS

Hereinafter, an embodiment of the present invention will be described with reference to the accompanying drawings.

The present invention relates to a polishing apparatus that detects wear occurring on a polishing surface of a polishing table for polishing and planarizing a substrate; and a wear detection method therefor.

Figure 1:
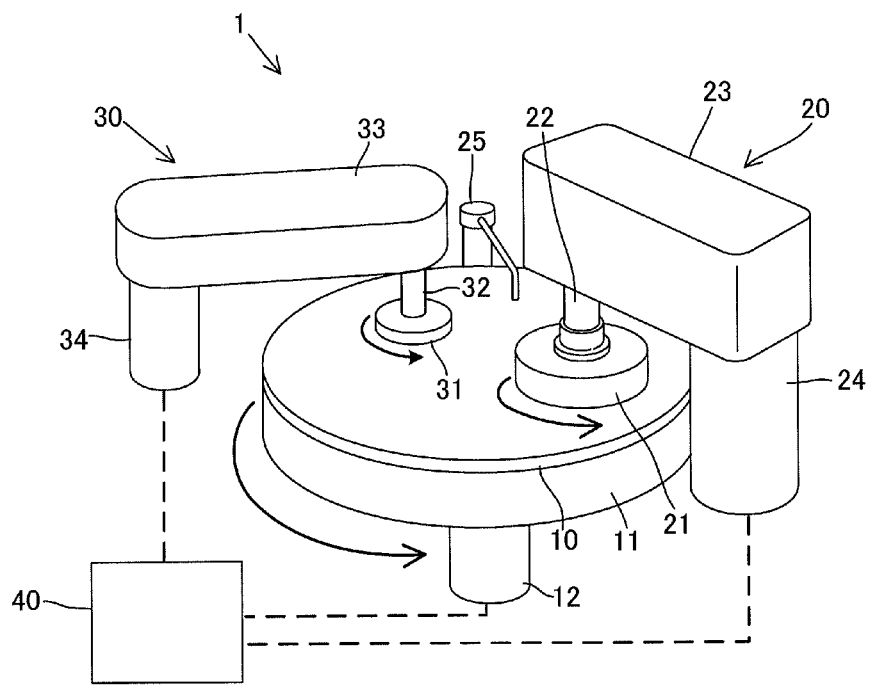
FIG. 1 is an external view of a polishing apparatus according to an embodiment of the present invention.

FIG. 1 is an external view of a polishing apparatus 1 according to an embodiment of the present invention.

The polishing apparatus 1 includes a polishing table 11 having a polishing pad 10 thereon; a top ring device 20 (substrate holding device) for polishing a substrate (to be polished) such as a semiconductor wafer in sliding contact with the polishing pad 10; a dressing device 30 for conditioning (dressing) the polishing pad 10; and a control unit 40 for controlling driving of the polishing table 11, the top ring device 20, and the dressing device 30.

The polishing pad 10 is mounted on an upper surface of the polishing table 11 in a manner such as by being attached thereto and an upper surface of the polishing pad 10 constitutes a polishing surface. The polishing table 11 is coupled to an unillustrated motor through a table drive shaft 12. The polishing table 11 and the polishing pad 10 are configured to be rotated by the motor in a circumferential direction indicated by the arrow in the figure. The motor of the polishing table 11 includes a table rotation speed sensor 13 (see FIG. 2) for detecting a value of rotation speed of the polishing table 11 and a table rotation torque sensor 14 (see FIG. 2) for detecting a value of rotation torque of the polishing table 11.

The top ring device 20 includes a top ring head 21 for holding a substrate and pressing the substrate against the upper surface of the polishing pad 10; a top ring drive shaft 22 coupled to the top ring head 21; and a top ring swing arm 23 for swingably holding the top ring drive shaft 22. The top ring swing arm 23 is supported by a top ring swing shaft 24. An unillustrated motor coupled to the top ring drive shaft 22 is disposed inside the top ring swing arm 23. The rotation of the motor is transmitted to the top ring head 21 through the top ring drive shaft 22, whereby the top ring head 21 rotates about the top ring drive shaft 22 in a circumferential direction indicated by the arrow in the figure.

A lower surface of the top ring head 21 constitutes a substrate holding surface for holding the substrate by vacuum contact or the like. The top ring drive shaft 22 is coupled to an unillustrated vertical motion actuator (for example, an air cylinder). Thus, the top ring head 21 vertically moves through the top ring drive shaft 22 by the vertical motion actuator. The top ring swing shaft 24 is located outside in the radial direction of the polishing pad 10. The top ring swing shaft 24 is rotatably configured by an unillustrated motor, whereby the top ring head 21 can move between a polishing position on the polishing pad 10 and a standby position outside the polishing pad 10.

A liquid supply mechanism 25 is disposed adjacent to the top ring device 20 to supply a polishing liquid and a dressing liquid to the polishing surface of the polishing pad 10. The liquid supply mechanism 25 supplies the polishing liquid and the dressing liquid to the polishing surface of the polishing pad 10 from a supply nozzle thereof. The liquid supply mechanism 25 serves as both a polishing liquid supply mechanism for supplying the polishing liquid to the polishing pad 10 and a dressing liquid supply mechanism for supplying the dressing liquid (for example, pure water) to the polishing pad 10. Note that the polishing liquid supply mechanism and the dressing liquid supply mechanism may be provided separately, this is, a plurality of supply nozzles may be provided.

Polishing of the substrate is performed as follows. Specifically, the substrate is held on the lower surface of the top ring head 21, and then the top ring head 21 and the polishing table 11 are rotated. In this state, the polishing liquid is supplied to the polishing surface of the polishing pad 10 and then the top ring head 21 presses the substrate against the polishing surface of the polishing pad 10. A surface (a lower surface) of the substrate is polished by the mechanical polishing action of abrasive particles contained in the polishing liquid and the chemical polishing action of the polishing liquid.

The dressing device 30 includes a dresser 31 in sliding contact with the polishing surface of the polishing pad 10; a dresser drive shaft 32 coupled to the dresser 31; and a dresser swing arm 33 for swingably holding the dresser drive shaft 32. A lower surface of the dresser 31 constitutes a dressing surface in sliding contact with the polishing surface of the polishing pad 10. Abrasive particles such as diamond particles are fixed to the dressing surface. The dresser swing arm 33 is supported by a dresser swing shaft 34. An unillustrated motor coupled to the dresser drive shaft 32 is disposed inside the dresser swing arm 33. Rotation of the motor is transmitted to the dresser 31 through the dresser drive shaft 32, whereby the dresser 31 is rotated about the dresser drive shaft 32 in a circumferential direction indicated by the arrow in the figure. The motor coupled to the dresser drive shaft 32 includes a dresser rotation speed sensor 35 (see FIG. 2) for detecting a value of rotation speed of the dresser 31; and a dresser rotation torque sensor 36 (see FIG. 2) for detecting a value of rotation torque of the dresser 31.

The dresser swing shaft 34 is located outside in the radial direction of the polishing pad 10. The dresser swing shaft 34 is configured to be rotatable by an unillustrated motor, whereby the dresser 31 can move between a dressing position on the polishing pad 10 and a standby position outside the polishing pad 10. In addition, the motor of the dresser swing shaft 34 includes a dresser swing torque sensor 37 (see FIG. 2) for detecting a value of swing torque of the dresser swing shaft 34.

Dressing of the polishing pad 10 is performed as follows. Specifically, during the polishing of the substrate or in an interval of the polishing of the substrate, the rotating dresser 31 is pressed against the rotating polishing pad 10. Dressing is performed for a predetermined time in a state in which the dresser 31 is fixed, and then the dresser swing shaft 34 is driven to swing the dresser 31. Thereby, the dresser 31 is moved in the radial direction of the polishing pad 10 and thus can dress the entire surface of the polishing pad 10.

Figure 2:
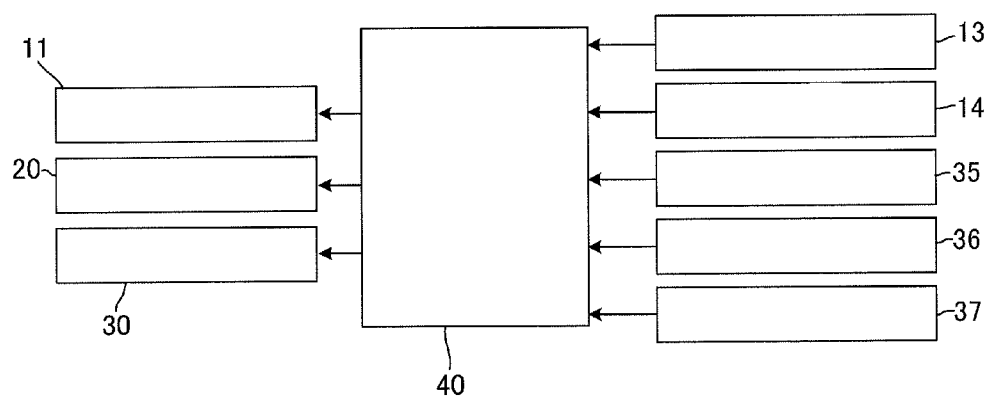
FIG. 2 is a block diagram of the polishing apparatus according to the embodiment of the present invention.

FIG. 2 is a block diagram of the polishing apparatus 1 according to the embodiment of the present invention. The control unit 40 includes, for example, a CPU (Central Processing Unit) for processing various data; and a memory for recording various data. The control unit 40 is communicably connected to the polishing table 11, the top ring device 20, and the dressing device 30 and can transmit a command signal to control driving of the polishing table 11, the top ring device 20, and the dressing device 30. For example, the control unit 40 transmits values of rotation speed and values of rotation torque of the dresser drive shaft 32 and a value of swing torque of the dresser swing shaft 34 as the command signals to the dressing device 30 to drive the dressing device. In addition, for example, the control unit 40 transmits values of rotation speed and values of rotation torque of the motor as the command signals to the polishing table 11 to drive the polishing table 11.

The table rotation speed sensor 13, the table rotation torque sensor 14, the dresser rotation speed sensor 35, the dresser rotation torque sensor 36, and the dresser swing torque sensor 37 are communicably connected to the control unit 40 and transmit data of values of rotation speed and values of torque detected by each sensor to the control unit 40. The transmitted data of values of rotation speed and values of torque is stored in the memory of the control unit 40. A warning notification unit 50 includes a display device such as a display and a sound device such as a speaker and notifies the user of a predetermined warning in response to a command from the control unit 40.

Here, the polishing apparatus 1 may encounter a problem in that when the polishing pad 10 is mounted on the polishing table 11, air (bubbles) may be mixed between the polishing pad 10 and the polishing table 11, resulting in that the polishing pad 10 slightly rises with respect to the polishing table 11. When chemical mechanical polishing is performed on a substrate such as a semiconductor wafer or dressing is performed on the polishing pad 10 in this state, the contact pressure between the raised portion of the polishing pad 10 and the dresser 31 is stronger than that of other portions, causing uneven wear to occur in the raised portion.

When uneven wear occurs on the polishing pad 10, the worn portion is flatter than other portions, thus increasing the contact area with the dresser 31 during dressing. Therefore, when the polishing pad 10 having uneven wear is dressed, the frictional resistance between the dresser 31 and the polishing pad 10 in the uneven wear portion becomes higher that the frictional resistance of other portions. The difference in the frictional resistance changes the value of rotation speed or the value of rotation torque of the dresser 31 (dresser drive shaft 32) and the polishing pad 10 (polishing table 11).

In addition, when the dresser 31 contacts the uneven wear portion of the polishing pad 10, the difference in the frictional resistance also affects the value of swing torque of the dresser swing shaft 34. More specifically, when there is no uneven wear in the polishing pad 10, the rotation of the polishing pad 10 applies a substantially constant frictional force to the dresser 31, so that the dresser swing shaft 34 fixes the dresser 31 at a predetermined position by a substantially constant swing torque. However, the difference in the frictional resistance changes the frictional force to be applied to the dresser 31 by the rotation of the polishing pad 10, thus changing the value of swing torque.

The present embodiment detects uneven wear of the polishing pad 10 in such a manner that the table rotation speed sensor 13, the table rotation torque sensor 14, the dresser rotation speed sensor 35, the dresser rotation torque sensor 36, and the dresser swing torque sensor 37 illustrated in FIG. 2 detect a change of at least one value from among the changes of the values of the rotation speed or the values of the rotation torque of the dresser 31 (dresser drive shaft 32) and the table drive shaft 12 (polishing pad 10), and the changes of the values of the swing torque of the dresser swing shaft 34. In particular, the values of the rotation speed and the rotation torque of the dresser 31 are the values of the motor for rotating the dresser 31 in direct contact with the polishing pad 10, and are significantly affected by the change of values due to uneven wear of the polishing pad 10.

Thus, the changes of the polishing pad 10 can be detected more accurately by detecting the values of the rotation speed and the rotation torque of the dresser 31.

Figure 3:
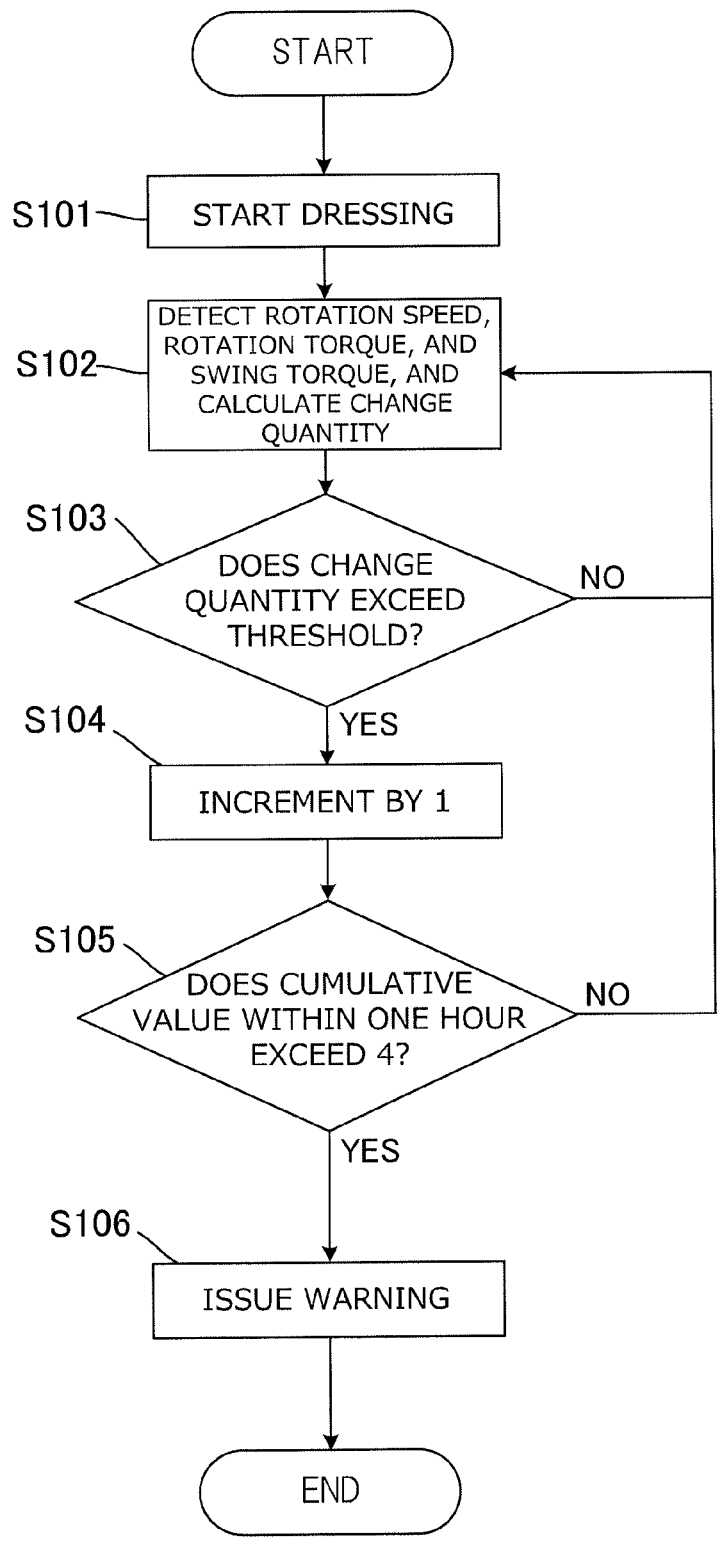
FIG. 3 is a flowchart describing a wear detection method according to the embodiment of the present invention.

FIG. 3 is a flowchart describing a wear detection method according to the embodiment of the present invention.

First, during the polishing of the substrate or in an interval of the polishing of the substrate, the control unit 40 transmits a command signal to the dresser drive shaft 32 and the dresser swing shaft 34 of the dressing device 30 to start dressing of the polishing pad 10 (S101).

Then, the table rotation speed sensor 13, the table rotation torque sensor 14, the dresser rotation speed sensor 35, the dresser rotation torque sensor 36, and the dresser swing torque sensor 37 start to detect the rotation speed and the rotation torque of the table drive shaft 12, the rotation speed and the rotation torque of the dresser drive shaft 32, and the swing torque of the dresser swing shaft 34 (S102). At this time, each sensor detects the value of the rotation speed, the value of the rotation torque, and the value of the swing torque at a predetermined time interval and transmits the detected values to the control unit 40. Here, the present embodiment preferably starts detection after a predetermined time (for example, three seconds) has elapsed since the dressing started. After a predetermined time (for example, three seconds) has elapsed since the dressing started, the values of the rotation speed, the rotation torque, and the swing torque of each mechanism are stabilized, and hence uneven wear can be accurately detected.

The control unit 40 receives the value of the rotation speed, the value of the rotation torque, and the value of the swing torque from each sensor and stores data of the values in the memory, and then calculates the change quantity thereof based on the values (S102). Note that the method of calculating the change quantity will be described later.

The control unit 40 compares the calculated change quantity with a preset threshold and determines whether or not the change quantity exceeds the threshold (S103). For example, the change quantity at the time when uneven wear occurs in the polishing pad 10 is obtained in advance by experiment, and the obtained change quantity can be used as the threshold.

If a determination is made that the change quantity does not exceed the threshold (S103: NO), the control unit 40 continues to calculate the change quantity based on the data of the value of the rotation speed, the value of the rotation torque, and the value of the swing torque received from each sensor (S102).

When a determination is made that the change quantity exceeds the threshold (S103: YES), the control unit 40 records one count in the memory of the control unit 40 (S104). The control unit 40 determines whether or not the cumulative value of the number of counts recorded within a predetermined time (for example, one hour) of the recorded counts exceeds a preset threshold (4 in the present embodiment) (S105). Specifically, in this example, the number of counts recorded more than one hour ago is not accumulated as the number of counts. In other words, the number of counts more than one hour ago is substantially cleared, which can prevent erroneous detection of uneven wear.

If a determination is made that the count value within a predetermined time (for example, one hour) does not exceed 4 (S105: NO), the control unit 40 continues to calculate the change quantity based on the data of the value of the rotation speed, the value of the rotation torque, and the value of the swing torque received from each sensor (S102).

If a determination is made that the count value within a predetermined time (for example, one hour) exceeds 4

(S105: YES), the control unit 40 determines that uneven wear occurs on the polishing pad 10 and issues a command to the warning notification unit 50. Then, the warning notification unit 50 notifies the user that uneven wear occurs (S106).

Figure 4:
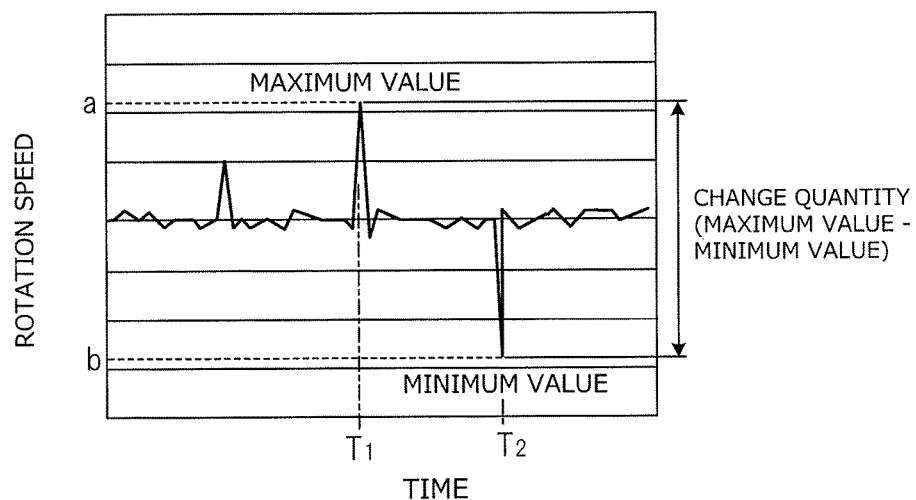
FIG. 4 is a graph illustrating an example of data of rotation speed of a dresser according to the embodiment of the present invention.

FIG. 4 is a graph illustrating an example of data of the rotation speed of the dresser 31 according to the embodiment of the present invention, the rotation speed being detected in step S102 illustrated in FIG. 3. In this graph, the vertical axis represents the rotation speed (rpm: Rotation per Minute) and the horizontal axis represents the time (in seconds) elapsed since the rotation speed was detected. As illustrated in this graph, the dresser rotation speed sensor 35 detects the rotation speed of the dresser 31 every predetermined time such as every 0.1 seconds.

As illustrated in FIG. 4, the rotation speed detected at time $T_1$ is indicated by "a" which means a maximum value of the rotation speed. Meanwhile, the rotation speed detected at time $T_2$ is indicated by "b" which means a minimum value of the detected rotation speed. The present embodiment uses the difference between the maximum value and the minimum value as the change quantity calculated based on the values of the detected rotation speed. In other words, the difference between the maximum value and the minimum value, namely, "a–b" is used as the change quantity. In step S103 illustrated in FIG. 3, "a–b" is compared with a preset threshold to determine whether or not the change quantity exceeds the threshold.

Likewise, the difference between a maximum value and a minimum value of the values of the detected rotation speed can also be used as the change quantity calculated based on the value of the detected rotation speed of the polishing table 11.

Figure 5:
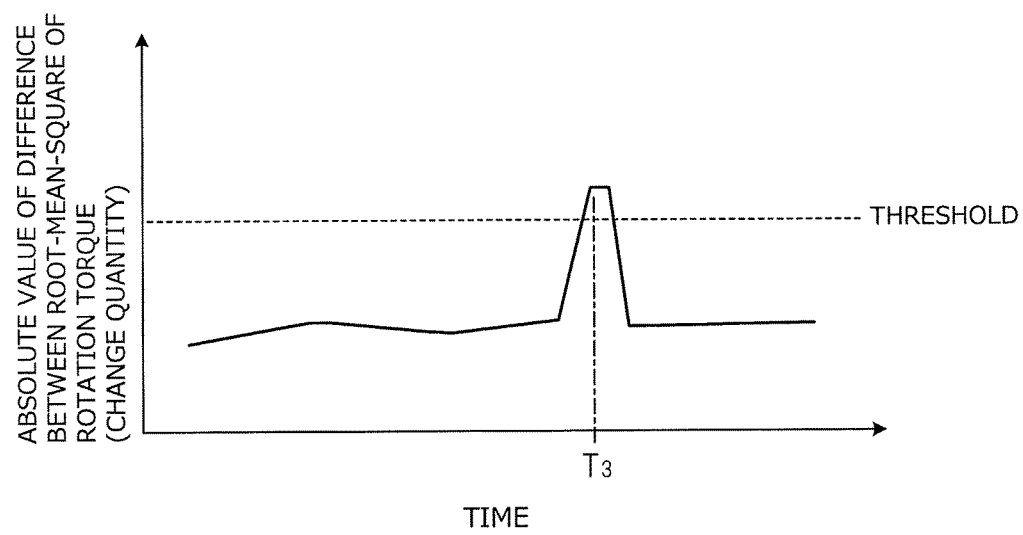
FIG. 5 is a graph illustrating an example of data of rotation torque of the dresser according to the embodiment of the present invention.

FIG. 5 is a graph illustrating data about rotation torque of the dresser 31 according to the embodiment of the present invention, the rotation torque being detected in step S102 illustrated in FIG. 3. In this graph, the vertical axis represents the absolute values of differences between the root-mean-square of the rotation torque and the horizontal axis represents the time elapsed since the start of detection of the rotation torque values. In the present embodiment, the dresser rotation torque sensor 36 detects the rotation torque (current value, in amperes) of the dresser 31, for example, in 0.1-second intervals.

In the present embodiment, the absolute value of the difference between the root-mean-square of the rotation torque is calculated, for example, in the following manner. First, the root-mean-square value of the continuously detected 5 values of the rotation torque is calculated. More specifically, a root-mean-square value a of 5 values of rotation torque at a time from 0.1 seconds to 0.5 seconds after the start of detecting the value of rotation torque is calculated. Then, a root-mean-square value b of 5 values of rotation torque at a time from 0.2 seconds to 0.6 seconds after the start of detecting the value of rotation torque is calculated. Furthermore, a root-mean-square value c of 5 values of rotation torque at a time from 0.3 seconds to 0.7 seconds after the start of detecting the value of rotation torque is calculated. Thereafter, in the same manner as described above, the root-mean-square values of 5 values of rotation torque are calculated.

The present embodiment uses the absolute value of the difference between the root-mean-square values continuously calculated in the above described manner as the change quantity calculated based on the detected rotation torque (values on the vertical axis of the graph in FIG. 5). Specifically, an absolute value of the difference between root-mean-square value "a" and root-mean-square value "b" and an absolute value of the difference between root-mean-square value "b" and root-mean-square value "c" are used as the change quantity. Thus calculated change quantity is compared with a preset threshold to determine whether or not the change quantity exceeds the threshold in step S103 illustrated in FIG. 3. In the graph of FIG. 5, the change quantity at time $T_3$ exceeds the threshold, and hence a determination is made that the change quantity exceeds the preset threshold in step S103 illustrated in FIG. 3.

Here, a root-mean-square value of the values of rotation torque is used to calculate the change quantity, whereby the change quantity considering the fluctuation width of the values of rotation torque can be calculated, for example, in comparison with using an arithmetic mean value.

Note that the absolute value of the difference between the root-mean-square values calculated in the same manner can also be used as the change quantity calculated based on the value of the detected swing torque of the dresser swing shaft 34 and the change quantity calculated based on the value of the detected rotation torque of the polishing table 11.

As described above, the embodiment of the present invention can detect uneven wear occurring on the polishing pad 10 and can detect an appropriate replacement timing of the polishing pad. Note that the above-described embodiment has described assuming that all of the value of the rotation speed and the value of the rotation torque of the table drive shaft 12, the value of the rotation speed and the value of the rotation torque of the dresser drive shaft 32, and the value of the swing torque of the dresser swing shaft 34 are to be detected, but uneven wear of the polishing pad 10 can be detected by at least one of the values. Furthermore, a plurality of the aforementioned values are detected, for example, both the value of the rotation speed and the value of the rotation torque of the dresser drive shaft 32 are detected, which can prevent erroneous detection in comparison with a method of detecting one value.

The present invention is not limited to the aforementioned embodiment, but various modifications can be made within the claims of the present invention and the scope of the technical concept disclosed in the description and the accompanying drawings. For example, in step S106 of the flowchart in FIG. 3, the control unit 40 compares the cumulative value of the number of counts recorded within one hour of the recorded counts with the threshold, but the time is not limited to one hour and may be appropriately changed. Furthermore, the threshold is not limited to 4, and may be appropriately changed.

In FIGS. 4 and 5, the value of the rotation speed and the value of the rotation torque are detected every 0.1 seconds, but the detection interval is not limited to this and may be appropriately changed.

What is claimed is:
1. A CMP apparatus having a detecting system of uneven wear of a polishing pad, comprising:
    a rotatable polishing table for disposing a polishing pad thereon, connected to a table drive shaft for rotation;
    a rotatable polishing head configured to hold and press a substrate against the polishing pad;
    a dressing device comprising,
        a rotatable dressing head having a dressing surface for dressing a polishing surface of the polishing pad, and connected to a dresser drive shaft to rotate the dressing head, and a dresser swing shaft connected to a swing actuator, and configured to move the dressing head between positions above the polishing table and outside the polishing table; and a detecting system for detecting an uneven wear of the polishing pad, comprising,
　　a sensor device to detect at least one of
　　　　a rotational speed of the polishing table,
　　　　a rotational torque applied to the polishing table by the table drive shaft,
　　　　a rotational speed of the dresser head,
　　　　a rotational torque applied to the dresser head by the dresser drive shaft, and
　　　　a swing torque applied to the dresser swing shaft by the swing actuator, and
　　a controller configured to receive each detected data from the sensor device, calculate a variation of the each detected data in a first predetermined period of time, and determine whether the calculated variation exceeds a first set of predetermined values to detect an uneven wear of the polishing pad.

2. The CMP apparatus according to claim 1, wherein the controller is configured to
　　receive the each detected data from the sensor device,
　　average the each detected data by averaging consecutive data of a second predetermined period of time,
　　calculate the variation(s) of the averaged detected data, and
　　determine whether the calculated variation(s) exceeds the first set of predetermined values to detect an uneven wear of the polishing pad.

3. The CMP apparatus according to claim 2, wherein the controller is configured to average the detected data using root mean square method.

4. The CMP apparatus according to 1, wherein the sensor device detects the rotational speed of the dresser head and the rotational torque applied to the dresser head by the dresser drive shaft.

5. The CMP apparatus according to claim 4, wherein the controller is configured to
　　receive the each detected data from the sensor device,
　　average the each detected data by averaging consecutive data of a predetermined number,
　　obtain the variation of the averaged detected data, and
　　determine whether the calculated variation exceeds the first set of predetermined values to detect an uneven wear of the polishing pad.

6. The CMP apparatus according to claim 1, wherein the controller sends a warning signal when the controller determines that the variation(s) exceeds the first predetermined value.

7. The CMP apparatus according to claim 1, wherein the controller is configured to start receiving the detected data from the sensor device at a predetermined period of time after the dressing device starts dressing.

8. The CMP apparatus according to claim 1, wherein the controller is configured to
　　receive each detected data from the sensor device,
　　obtain a variation of the each detected data in a first predetermined period of time,
　　determine whether the calculated variation exceeds a first set of predetermined values to detect an uneven wear of the polishing pad,
　　count a number of times in which the variation exceeds the first set of predetermined values for a second predetermined period of time, and
　　send a warning if the number exceeds a second predetermined number.

9. A method for detecting uneven wear of a polishing pad placed on a polishing table of a polishing apparatus, the method comprising:
　　providing a polishing apparatus having a polishing table with a polishing pad thereon, and a dressing head having a dressing surface and connected to a dresser swing shaft,
　　rotating the polishing pad with the polishing table,
　　rotating the dressing surface of the dressing head,
　　dressing the polishing pad by pressing the rotating dressing surface of the dressing head against the rotating polishing pad,
　　swinging the dressing head on the polishing pad with the dresser swing shaft,
　　detecting by a sensor device at least one of
　　　　a rotational speed of the polishing table,
　　　　a rotational torque applied to the polishing table,
　　　　a rotational speed of the dresser head,
　　　　a rotational torque applied to the dresser head, and
　　　　a swing torque applied to the dresser swing shaft,
　　receiving the detected data by a controller from the sensor device,
　　obtaining a variation of the detected data of a predetermined period of time by the controller, and
　　determining by the controller whether the calculated variation exceeds a first predetermined value to detect an uneven wear of the polishing pad.

10. The method according to claim 9, further comprising:
　　receiving the each detected data by the controller from the sensor device,
　　averaging the each detected data by averaging consecutive data of a second predetermined period of time by the controller,
　　calculating the variation(s) of the averaged detected data by the controller, and
　　determine by the controller whether the calculated variation(s) exceeds the first set of predetermined values to detect an uneven wear of the polishing pad.

11. The method according to claim 10, wherein averaging the each detected data includes averaging the detected data using root mean square method.

12. The method according to claim 9, further comprising:
　　detecting by the sensor device the rotational speed of the dresser head and the rotational torque applied to the dresser head by the dresser drive shaft.

13. The method according to claim 12, further comprising:
　　receiving the each detected data by the controller from the sensor device,
　　averaging the each detected data by averaging consecutive data of a predetermined number by the controller,
　　obtaining the variation of the averaged detected data by the controller, and
　　determine by the controller whether the calculated variation exceeds the first set of predetermined values to detect an uneven wear of the polishing pad.

14. The method according to claim 9, further comprising:
　　sending a warning signal when the controller determines that the variation(s) exceeds the first predetermined value.

15. The method according to claim 9, further comprising:
　　receiving the detected data by the controller from the sensor device at a predetermined period of time after the dressing device starts dressing.

16. The method according to claim 9, further comprising:
receiving each detected data by the controller from the sensor device,
obtaining a variation of the each detected data in a first predetermined period of time by the controller,
determining by the controller whether the calculated variation exceeds a first set of predetermined values to detect an uneven wear of the polishing pad,
counting by the controller a number of times in which the variation exceeds the first set of predetermined values for a second predetermined period of time, and
sending a warning if the number exceeds a second predetermined number.

\* \* \* \* \*